(12) United States Patent
Boudreau et al.

(10) Patent No.: US 8,749,966 B1
(45) Date of Patent: Jun. 10, 2014

(54) DATA STORAGE DRIVE CARRIER

(75) Inventors: Maida Boudreau, Brimfield, MA (US); Ilhan C. Gundogan, Lexington, MA (US); Albert F. Beinor, Jr., Sutton, MA (US); Joseph P. King, Jr., Sterling, MA (US); Joseph L. Brigham, Jr., North Attleborough, MA (US); Keith C. Johnson, Medway, MA (US); Qingqiang Guo, Shanghai (CN); Brian Cunningham, Westborough, MA (US)

(73) Assignee: EMC Corporation, Hopkinton, MA (US)

( * ) Notice: Subject to any disclaimer, the term of this patent is extended or adjusted under 35 U.S.C. 154(b) by 244 days.

(21) Appl. No.: 12/644,033

(22) Filed: Dec. 22, 2009

(51) Int. Cl.
G06F 1/16 (2006.01)
H05K 5/00 (2006.01)
H05K 7/00 (2006.01)

(52) U.S. Cl.
USPC .................................................. 361/679.33

(58) Field of Classification Search
USPC ....................................... 361/679.33–679.39
See application file for complete search history.

(56) References Cited

U.S. PATENT DOCUMENTS

| | | | | |
|---|---|---|---|---|
| 5,682,291 | A * | 10/1997 | Jeffries et al. | 361/679.58 |
| 6,002,658 | A * | 12/1999 | Aso et al. | 720/651 |
| 6,058,016 | A * | 5/2000 | Anderson et al. | 361/727 |
| 6,231,224 | B1 * | 5/2001 | Gamble et al. | 362/551 |
| 6,490,153 | B1 * | 12/2002 | Casebolt et al. | 361/679.33 |
| 6,515,854 | B1 * | 2/2003 | Claprood | 361/679.33 |
| 6,560,098 | B1 | 5/2003 | Beinor, Jr. et al. | |
| 6,565,163 | B2 * | 5/2003 | Behl et al. | 312/223.1 |
| 6,636,422 | B1 * | 10/2003 | Tanzer et al. | 361/679.46 |
| 6,798,650 | B2 * | 9/2004 | Reznikov et al. | 361/679.33 |
| 6,912,124 | B2 * | 6/2005 | Megason et al. | 361/679.02 |
| 6,927,973 | B2 * | 8/2005 | Song et al. | 361/679.33 |
| 7,016,190 | B1 * | 3/2006 | Chang | 361/679.33 |
| 7,032,119 | B2 * | 4/2006 | Fung | 713/320 |
| 7,035,096 | B2 * | 4/2006 | Franz et al. | 361/679.32 |
| 7,068,500 | B1 * | 6/2006 | Beinor et al. | 361/679.33 |
| 7,130,187 | B1 * | 10/2006 | Sun | 361/679.34 |
| 7,193,844 | B2 * | 3/2007 | Garnett et al. | 361/679.33 |
| 7,312,999 | B1 * | 12/2007 | Miyamura et al. | 361/724 |
| 7,362,566 | B1 * | 4/2008 | Sivertsen | 361/679.33 |
| 7,379,294 | B2 * | 5/2008 | Chen | 361/679.33 |
| 7,483,268 | B1 * | 1/2009 | King, Jr. et al. | 361/679.38 |
| 7,492,586 | B2 * | 2/2009 | Peng et al. | 361/679.33 |
| 7,515,410 | B1 * | 4/2009 | Dingfelder et al. | 361/679.33 |
| 7,548,418 | B2 * | 6/2009 | Martin et al. | 361/679.37 |
| 7,583,507 | B2 * | 9/2009 | Starr et al. | 361/727 |
| 7,684,181 | B2 * | 3/2010 | Peng et al. | 361/679.33 |

(Continued)

*Primary Examiner* — Adrian S Wilson
(74) *Attorney, Agent, or Firm* — Krishnendu Gupta; Konrad R. Lee

(57) ABSTRACT

A data storage drive carrier configured for insertion into 2U or 3U slots not an electrocal chassis. The carrier has opposing side members and front and back members. A first side member is fixedly attached to the front member to form a rigid L-shaped portion of the carrier; and a second side member and the back member are pivotally attached to the L-shaped portion. The second one of side members and the back member are pivotally attached to the L-shaped portion at first ends and second ends thereof are attached to together to form a closed frame after receiving therein the drive. A light pipe is disposed within a groove formed in one of the side members, one end of the pipe being disposed adjacent to a light source of a rearward interposer to receive optical signal emitted by the source and an opposite end disposed adjacent a front end of the carrier.

9 Claims, 15 Drawing Sheets

(56) References Cited

U.S. PATENT DOCUMENTS

| | | | |
|---|---|---|---|
| 7,684,182 B2* | 3/2010 | Zhang et al. | 361/679.33 |
| 7,701,703 B2* | 4/2010 | Peng et al. | 361/679.33 |
| 7,729,110 B2* | 6/2010 | Zhang et al. | 361/679.33 |
| 7,782,606 B2* | 8/2010 | Baker et al. | 361/679.39 |
| 7,864,519 B2* | 1/2011 | Lin et al. | 361/679.33 |
| 8,456,832 B1* | 6/2013 | Brigham et al. | 361/679.35 |
| 2002/0067592 A1* | 6/2002 | Horiuchi et al. | 361/685 |
| 2003/0206402 A1* | 11/2003 | Tsuyuki et al. | 361/725 |
| 2004/0012921 A1* | 1/2004 | Hidaka et al. | 361/685 |
| 2005/0185374 A1* | 8/2005 | Wendel et al. | 361/685 |
| 2006/0023413 A1* | 2/2006 | Lo et al. | 361/684 |
| 2006/0181845 A1* | 8/2006 | Shah et al. | 361/685 |
| 2006/0248360 A1* | 11/2006 | Fung | 713/300 |
| 2007/0101173 A1* | 5/2007 | Fung | 713/300 |
| 2007/0206351 A1* | 9/2007 | Szelong et al. | 361/685 |
| 2007/0211422 A1* | 9/2007 | Liu et al. | 361/685 |
| 2007/0230105 A1* | 10/2007 | Su | 361/685 |
| 2007/0230111 A1* | 10/2007 | Starr et al. | 361/685 |
| 2007/0233781 A1* | 10/2007 | Starr et al. | 709/203 |
| 2007/0247804 A1* | 10/2007 | Li et al. | 361/687 |
| 2008/0013272 A1* | 1/2008 | Bailey et al. | 361/685 |
| 2008/0157638 A1* | 7/2008 | Liu et al. | 312/223.2 |
| 2008/0158810 A1* | 7/2008 | Liu et al. | 361/685 |
| 2008/0278856 A1* | 11/2008 | Peng et al. | 360/244.3 |
| 2009/0059507 A1* | 3/2009 | Peng et al. | 361/685 |
| 2009/0103252 A1* | 4/2009 | Peng et al. | 361/679.4 |
| 2009/0129009 A1* | 5/2009 | Zhang et al. | 361/679.34 |
| 2009/0237877 A1* | 9/2009 | Honda et al. | 361/679.39 |
| 2009/0257185 A1* | 10/2009 | Signer et al. | 361/679.32 |
| 2009/0273896 A1* | 11/2009 | Walker et al. | 361/679.33 |
| 2009/0279244 A1* | 11/2009 | Crippen et al. | 361/679.33 |
| 2010/0172087 A1* | 7/2010 | Jeffery et al. | 361/679.33 |
| 2010/0187957 A1* | 7/2010 | Liang | 312/223.2 |
| 2010/0309621 A1* | 12/2010 | Chang et al. | 361/679.39 |
| 2010/0321879 A1* | 12/2010 | Peng et al. | 361/679.33 |
| 2011/0069441 A1* | 3/2011 | Killen et al. | 361/679.33 |
| 2011/0080705 A1* | 4/2011 | Figuerado et al. | 361/679.33 |
| 2011/0128696 A1* | 6/2011 | Weng | 361/679.35 |

* cited by examiner

DATA STORAGE DRIVE CARRIER

TECHNICAL FIELD

This disclosure relates generally to data storage drive carriers.

BACKGROUND

As is known in the art, enterprises in the data storage industry perpetually face demand from their customers to produce storage solutions that achieve ever-increasing data storage density. One approach to achieving high storage density is to pack as many data storage drives (such as, for example, magnetic data storage drives, generally known as disk drives (or Hard Disk Drives (HDDs) and electronic data storage drives, generally known as solid state drives (SSDs)) as possible into an array enclosure.

This approach, however, is fraught with difficulties. For example, spacing between drives installed in neighboring chassis bays or slots within an electrical cabinet is often too small to permit personnel, limited to use of their fingertips, to establish a firm grasp of an individual drive. Thus, such personnel can have difficulties removing a drive from a chassis, not being able to apply sufficient extracting force to overcome the resistance of mated connectors between the drive and an enclosure midplane. Inserting a drive into the midplane can also become an imprecise art; personnel may not insert the drive sufficiently far to make adequate electrical contact. In addition, some drives require a companion "personality card" or interposer (a printed circuit board having electrical components configured to match the operation of the drive to the protocol to be used by the drive and thus determines the functionality of the drive.

A typical data storage system includes data moving circuitry and an array of disk drives. Some data storage systems fit within standard-sized equipment cabinets or racks. Such cabinets are commonly available in a variety of standard heights (e.g., 4U, 3U, 2U and 1U, where U is a standard measure of vertical height in the equipment cabinet and is equal to 1.75 inches in accordance with the EIA-310-D industry standard). Still further, it would be desirable to have a drive carrier adapted for use with a 2.5 inch drive and to store such drive within the carrier in a cabinet having a 2U or 3U space. Further, carriers may introduce complexity and expense to the constructing drive assemblies, often involving several small, hard-to-handle hardware components, such as screws and rivets.

SUMMARY

In one embodiment, a 2U or 3U electrical chassis is provided having a plurality of slots for receiving therein data storage drive carriers having therein a 2.5 inch data storage drive.

In one embodiment, the electrical chassis is provided comprising: a data storage carrier; and a data storage drive disposed in the carrier. The carrier comprises: a pair of opposing side members; a front member; and a back member. A first one of the pair of opposing side members is connected to a first one of the front and back members; and a second one of the pair of opposing side members and a second one of the front and back members are pivotally attached to the carrier.

In one embodiment, the first one of the pair of opposing side members is fixedly attached to the first one of the front and back members to form a ridged L-shaped portion of the carrier.

In one embodiment, the second one of the pair of opposing side members and the second one of the front and back members are pivotally attached to the L-shaped portion of the carrier at first ends thereof and second ends thereof are attached to together to form a closed frame having a rectangular-shaped window after receiving and storing therein a data storage drive.

In one embodiment, the second ends are snapped together to form the closed frame.

In one embodiment, a front end of the data storage drive abuts the front member with the data storage drive received within the carrier.

In one embodiment, one of the chassis comprises: a data storage carrier and a data storage drive disposed in the carrier. The carrier comprises: a pair of opposing side members; and an interposer having a printed circuit board with electrical components thereon disposed a back end of the carrier, one of such components including a light source, the interposer being plugged into a back end of a data storage drive. One of the pair of opposing side members has a groove formed therein. A light pipe disposed within the groove, one end of the light pipe being disposed adjacent to the light source to receive optical signal emitted by the light source and an opposite end of the light pipe being disposed adjacent a front end of the carrier.

In one embodiment, a spring is attached to the front member. A handle is pivotally mounted to the front member, the spring being disposed between the handle and the front member. When the handle is pivoted towards the front member, the spring compresses and urging the data storage drive towards the back member. Further, when the handle is pivoted towards the front member, the spring compresses and urges plug on the interposer further into an electrical receptacle on a backplane in the chassis. Any manufacturing tolerances are taken by the degree of compression of the spring.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
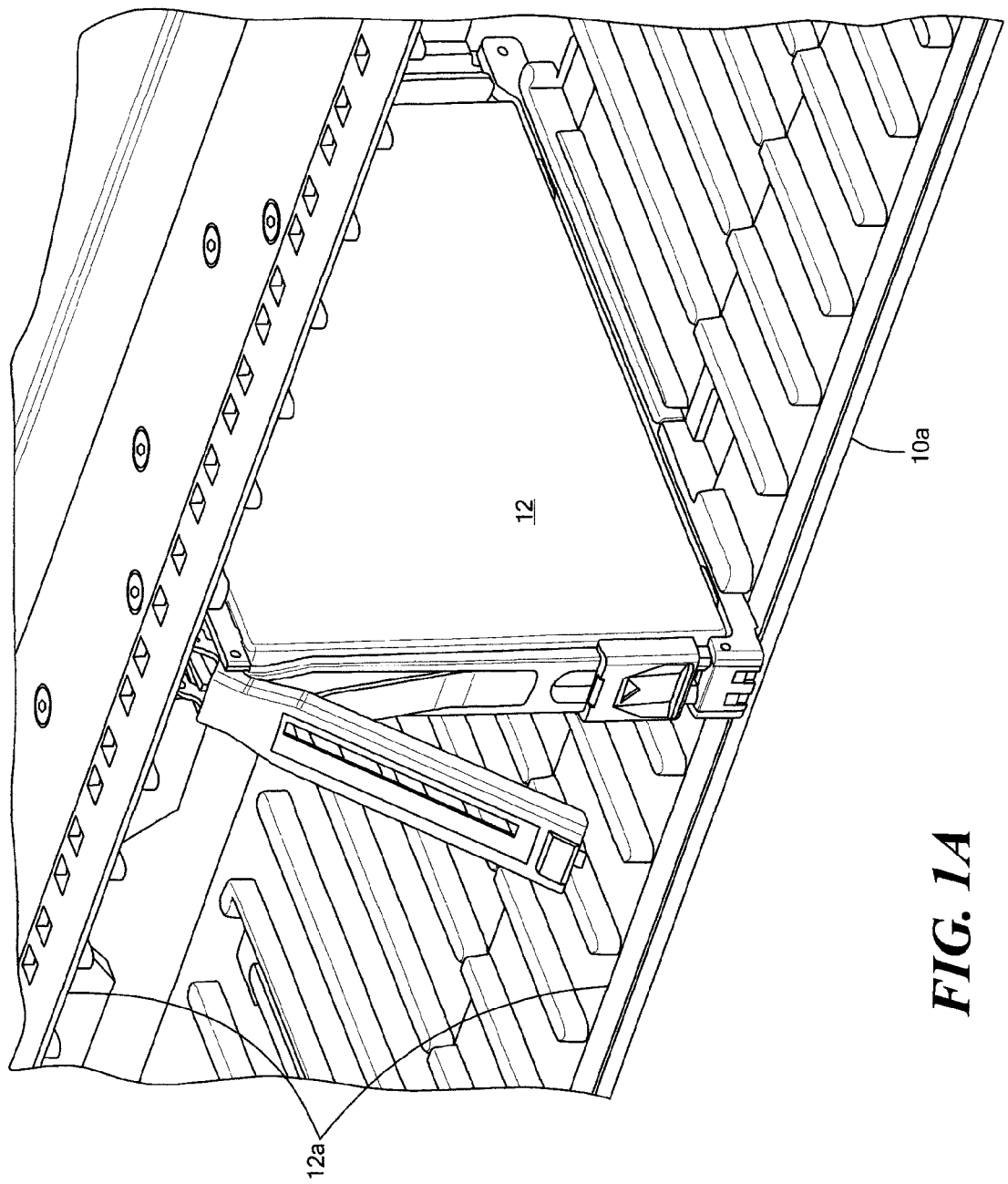
FIGS. 1A and 1B are perspective sketches of electrical chassis that fit within cabinets, not shown, the FIGS. showing 2U or 3U chassis having a plurality of slots or bays, respectively, at least one of the slots for receiving 2.5 inch data storage drive retained within data storage drive carrier according to an embodiment of the invention.
Figure 1B:
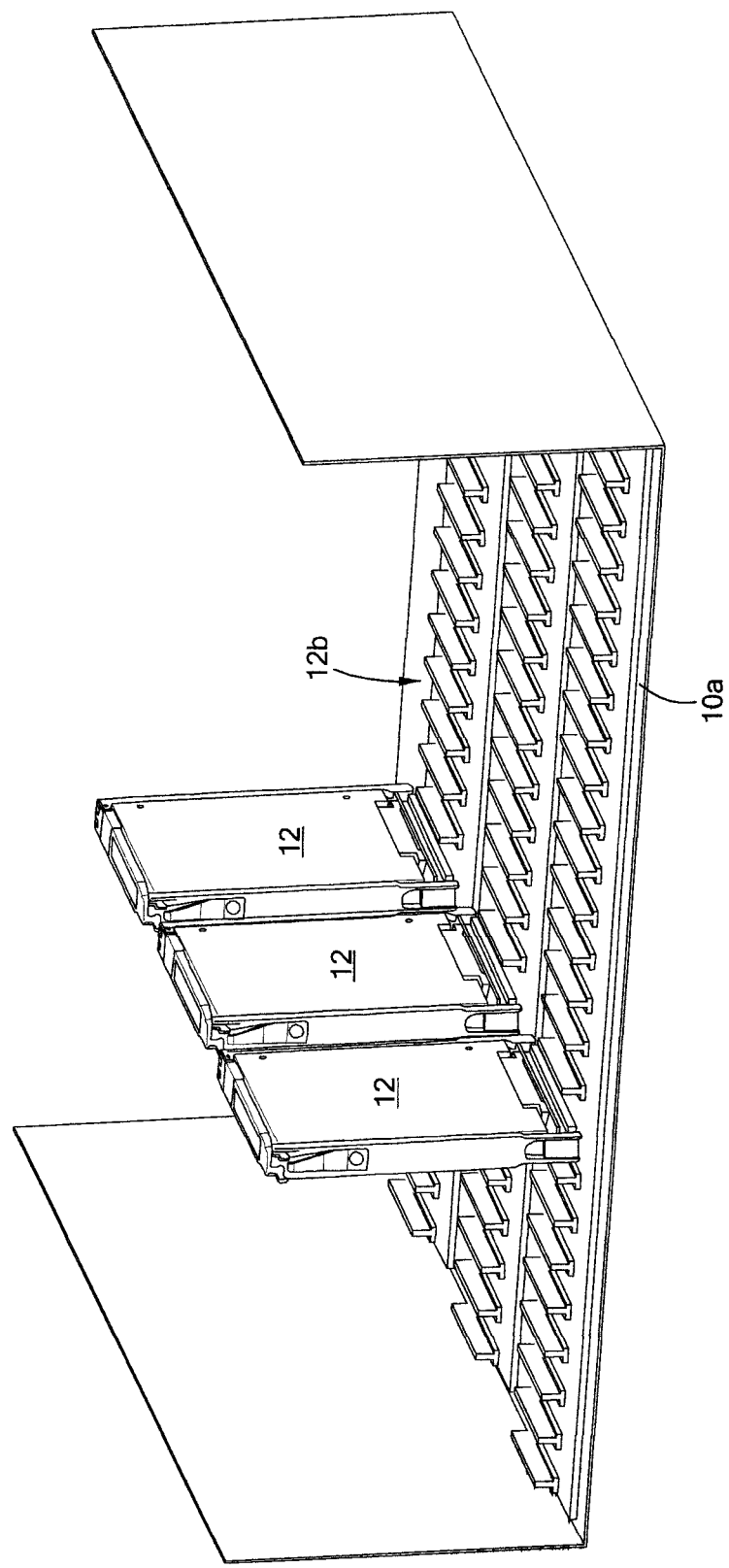
Figure 2:
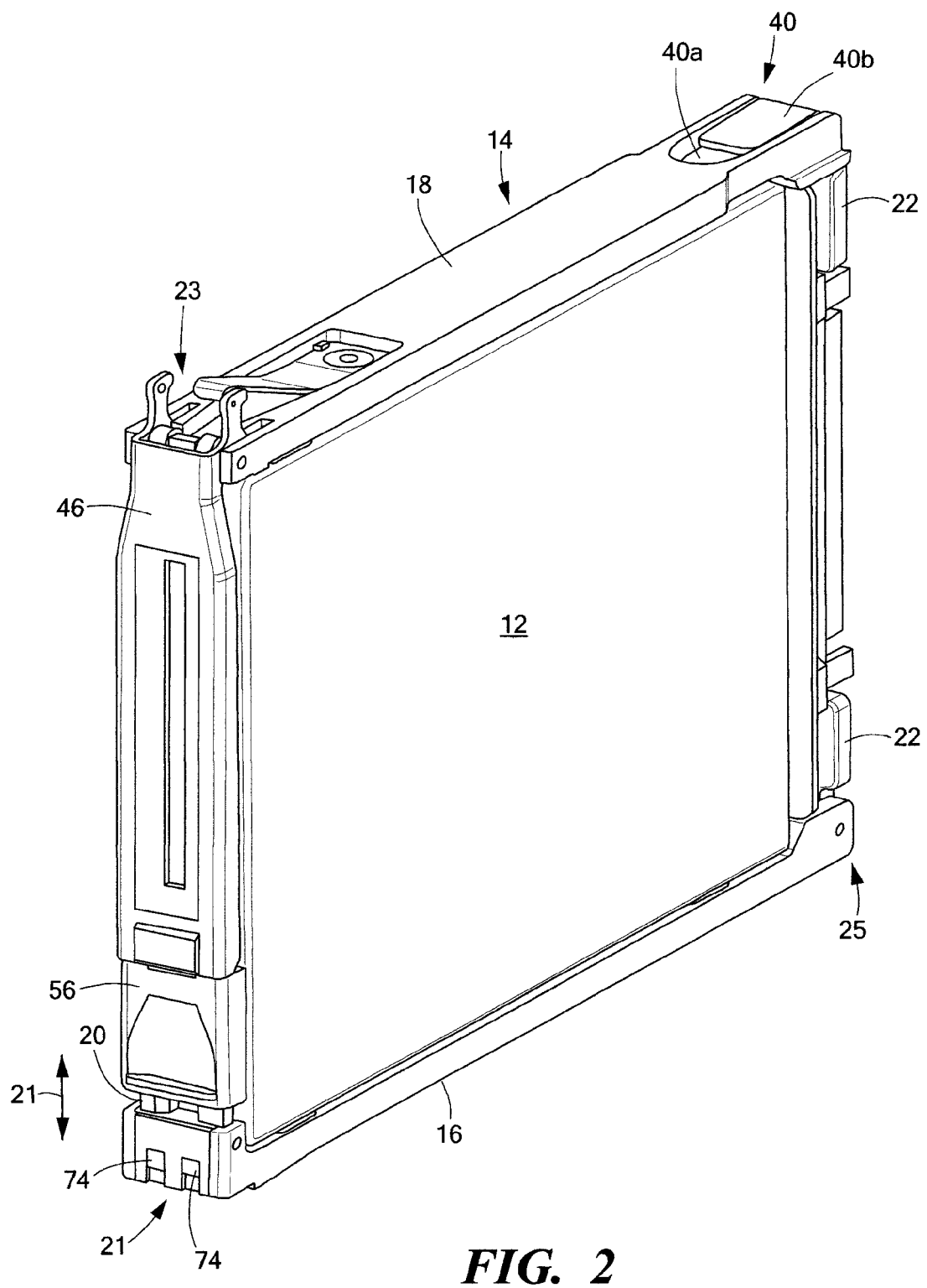
FIG. 2 is a perspective drawing of one of the data storage drive carriers according to an embodiment of the invention having one of the 2.5 inch data storage drives retained therein.

Referring now to FIGS. 1A and 1B, electrical chassis 10a and 10b are shown, respectively; chassis 10a having a plurality of 2U slots or bays 12a, at least one of the slots for receiving a 2.5 inch data storage drive 12; and cabinet 10b having a plurality of 3U slots or bays 12b, at least one of the slots for receiving the same 2.5 inch Small Form Factor (SFF) data storage drive 12. Each one of the data storage drives 12 is carried by a data storage drive carrier 14, as shown in FIGS. 1 and 2.

Figure 3A:
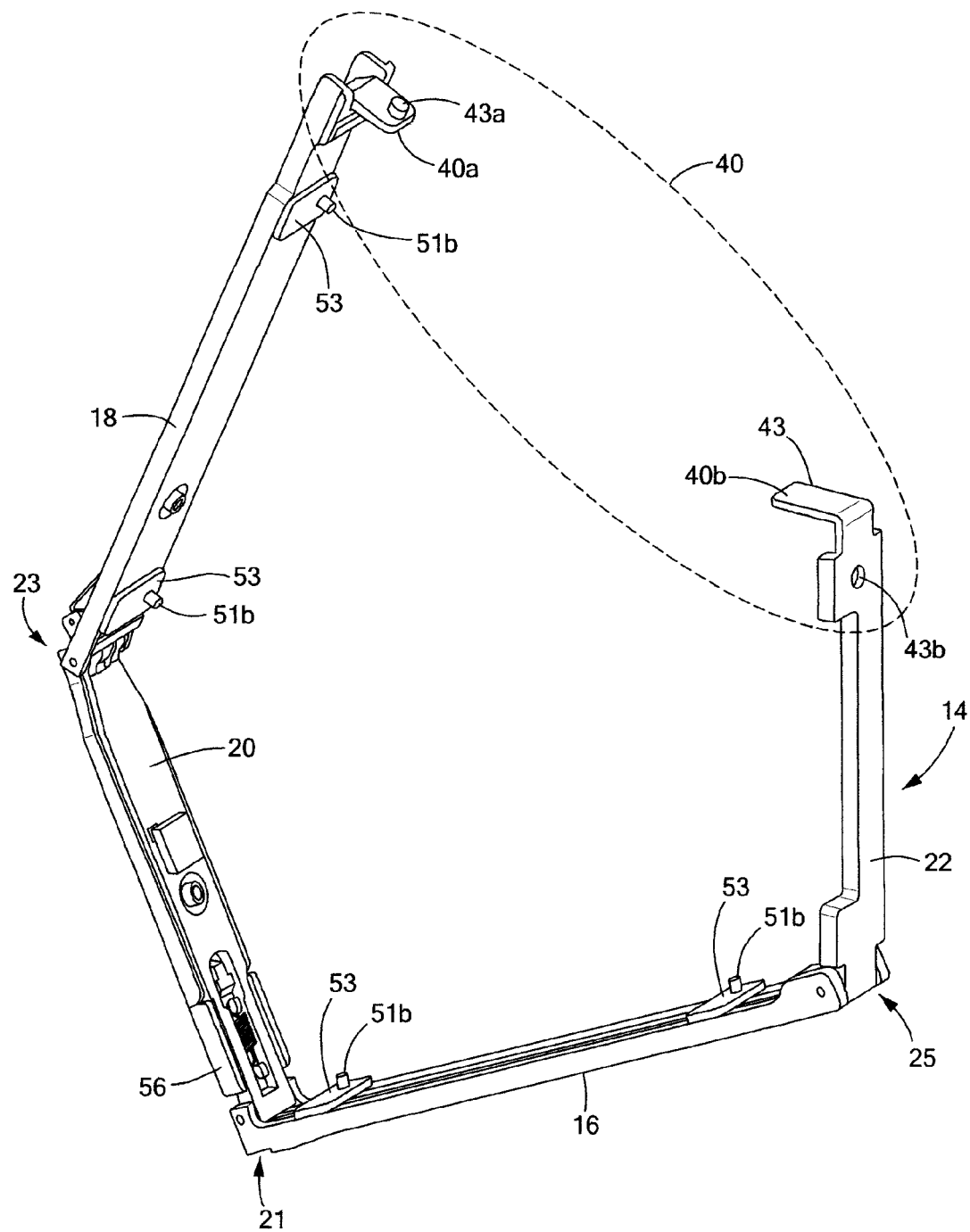
FIGS. 3A and 3B are different perspective drawings of one of the data storage drive carrier of FIG. 2.
Figure 3B:
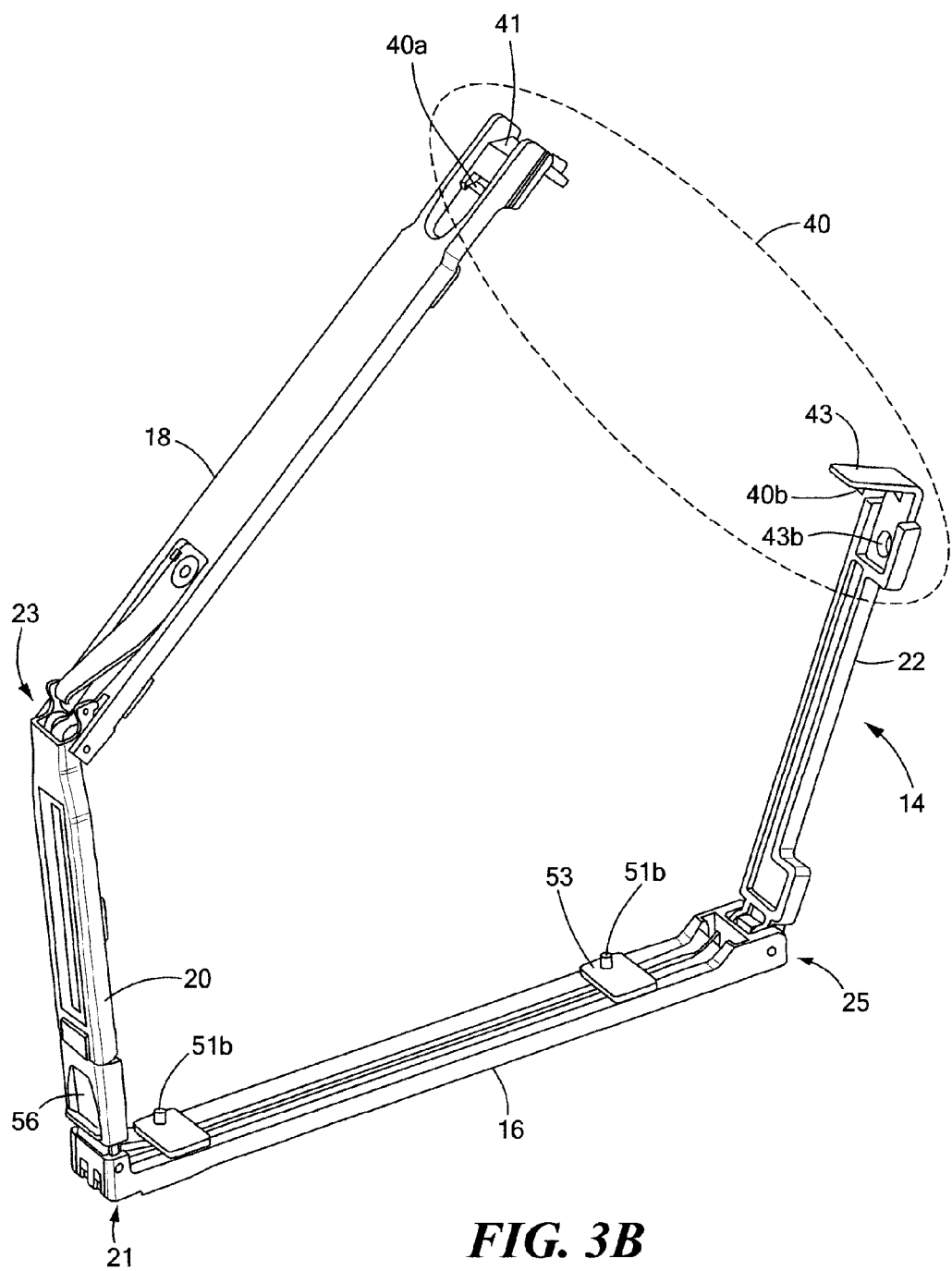

The data storage drive carrier 14 is shown in FIGS. 3A and 3B to include: a pair of opposing metal side members 16, 18; a metal front member 20; and a plastic back member 22. A first one of the pair of opposing side members, here member 16 is fixedly attached at a ninety degree angle to a first one of the front and back members, here to front member 20 at corner 21 to form a rigid L-shaped portion of the four-sided rectangular carrier 14. A second one of the pair of opposing side members, here member 18 and the front member 20 are pivotally attached to the L-shaped portion of the carrier 14 at corner 23. The second end of the first one of the pair of opposing side members, here member 16 and a second one of the front and back members, here back member 22 are pivotally attached to the L-shaped portion of the carrier 14 at corner 25. The remaining ends (herein sometimes referred to as the "free ends") of the second side member 18 and the back member 22 have affixed thereto respective, engageable elements 40a, 40b of a snap 40. Here the snap is a resilient plastic; element 40b being a projection formed in the plastic and element 40a being a slot for engaging the projection. When the two "free ends: are manually brought together, the projection 40b rides up a ramp or cam surface 41, lifting up the cantilevered arm 43, upon which the projection is held, rides upward and then when aligned with the slot, snaps into the slot. Thus, when the free ends are snapped together, a closed frame is formed a rectangular-shaped window after receiving and storing therein the data storage drive 12, as shown in FIG. 2. The process of capturing the data storage drive 12 is illustrated by the sequence shown in FIGS. 4A through 4C. It is also noted that when snapped together a post 43a (FIG. 4A) on side member 18 is positioned in a hole 43b. The post 43a when inserted into the hole 43b prevents the structure from twisting out of plane (i.e., to keep member 18 and element 40a from becoming disengaged from element 40b and arm 43).

Figure 4A:
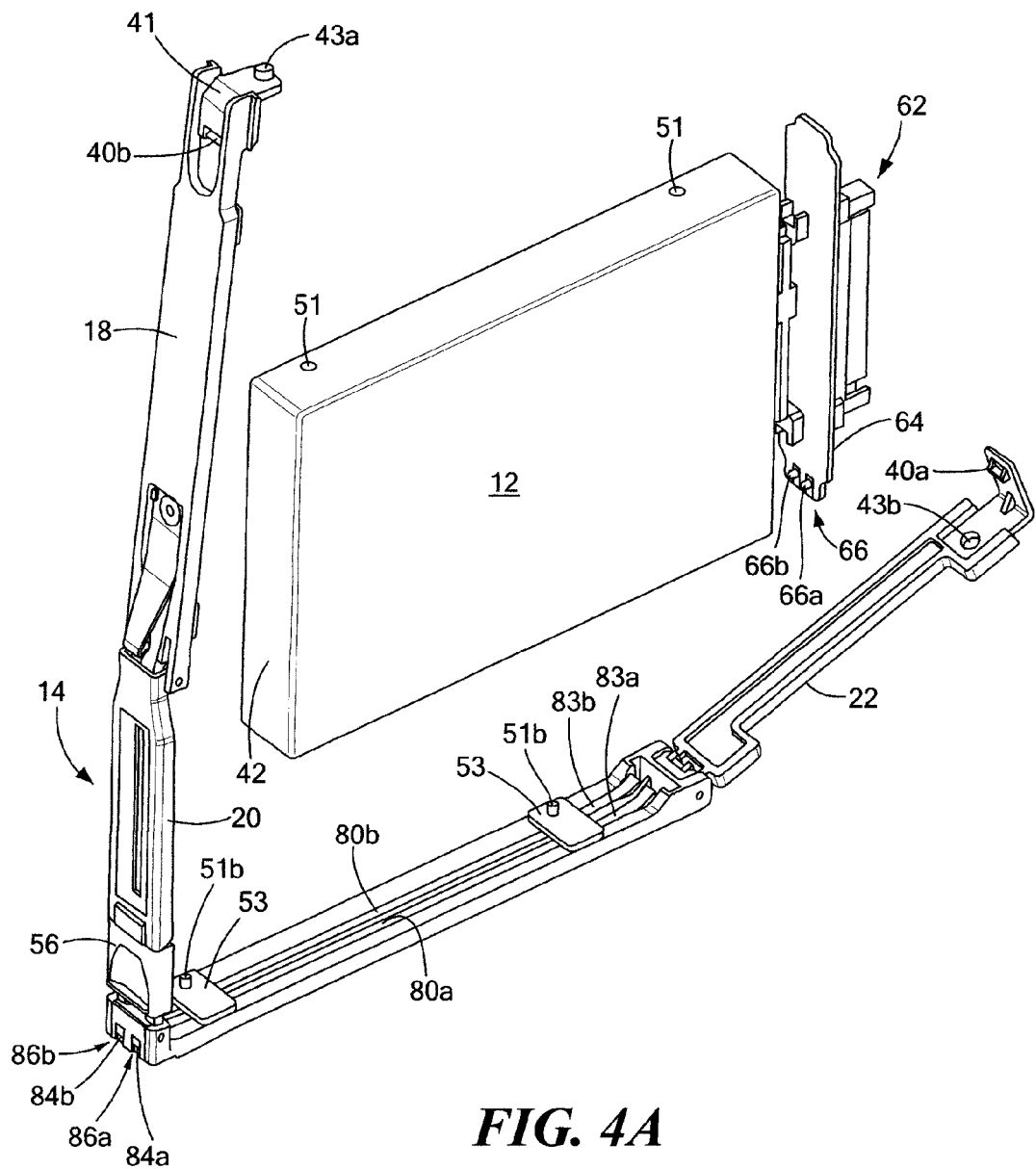
FIGS. 4A through 4C are perspective drawings of one of the data storage drive carrier of FIG. 2 at different stages of such carrier being manipulated to have retained therein the data storage drive of FIG. 2.
Figure 4B:
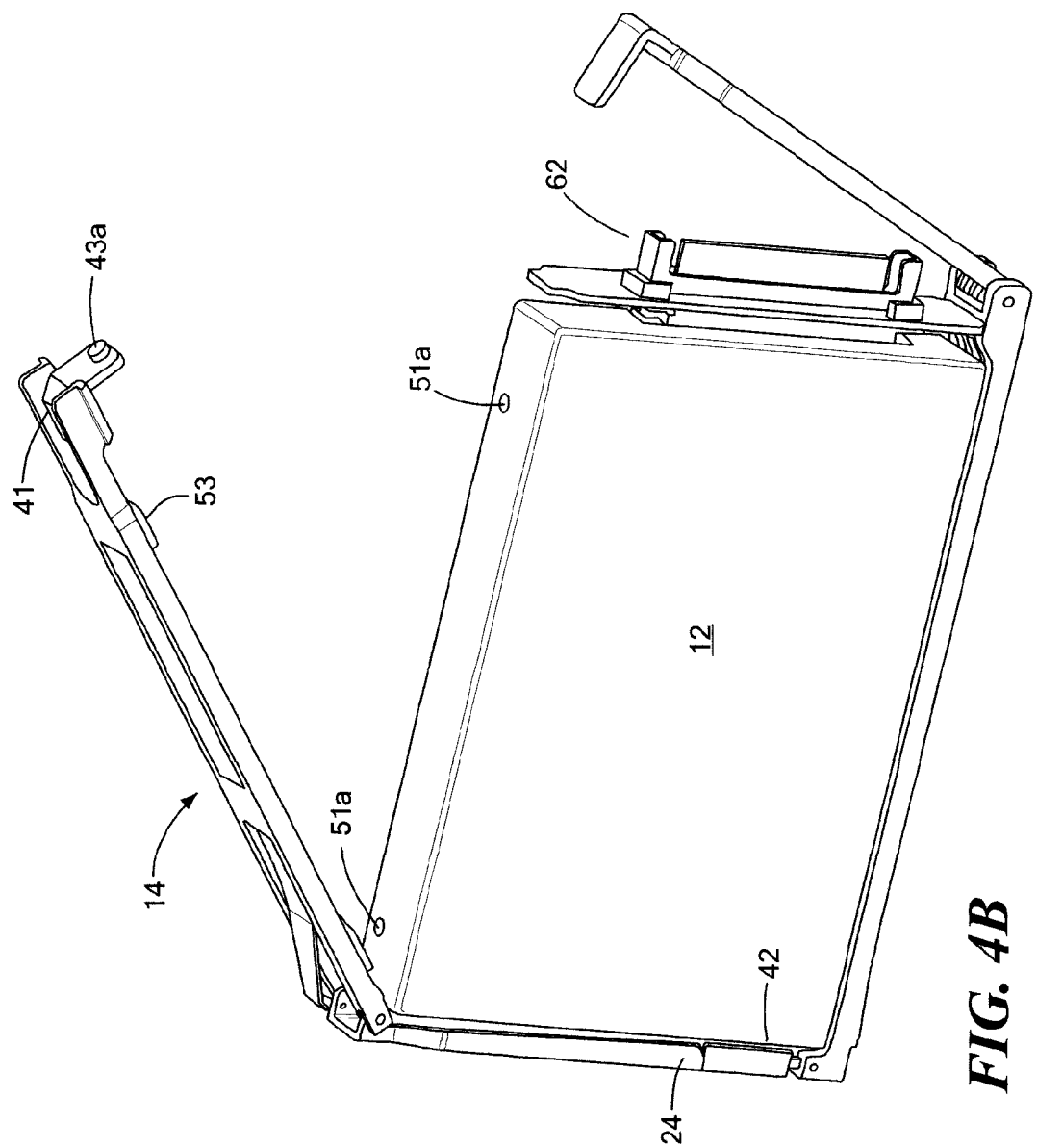
Figure 4C:
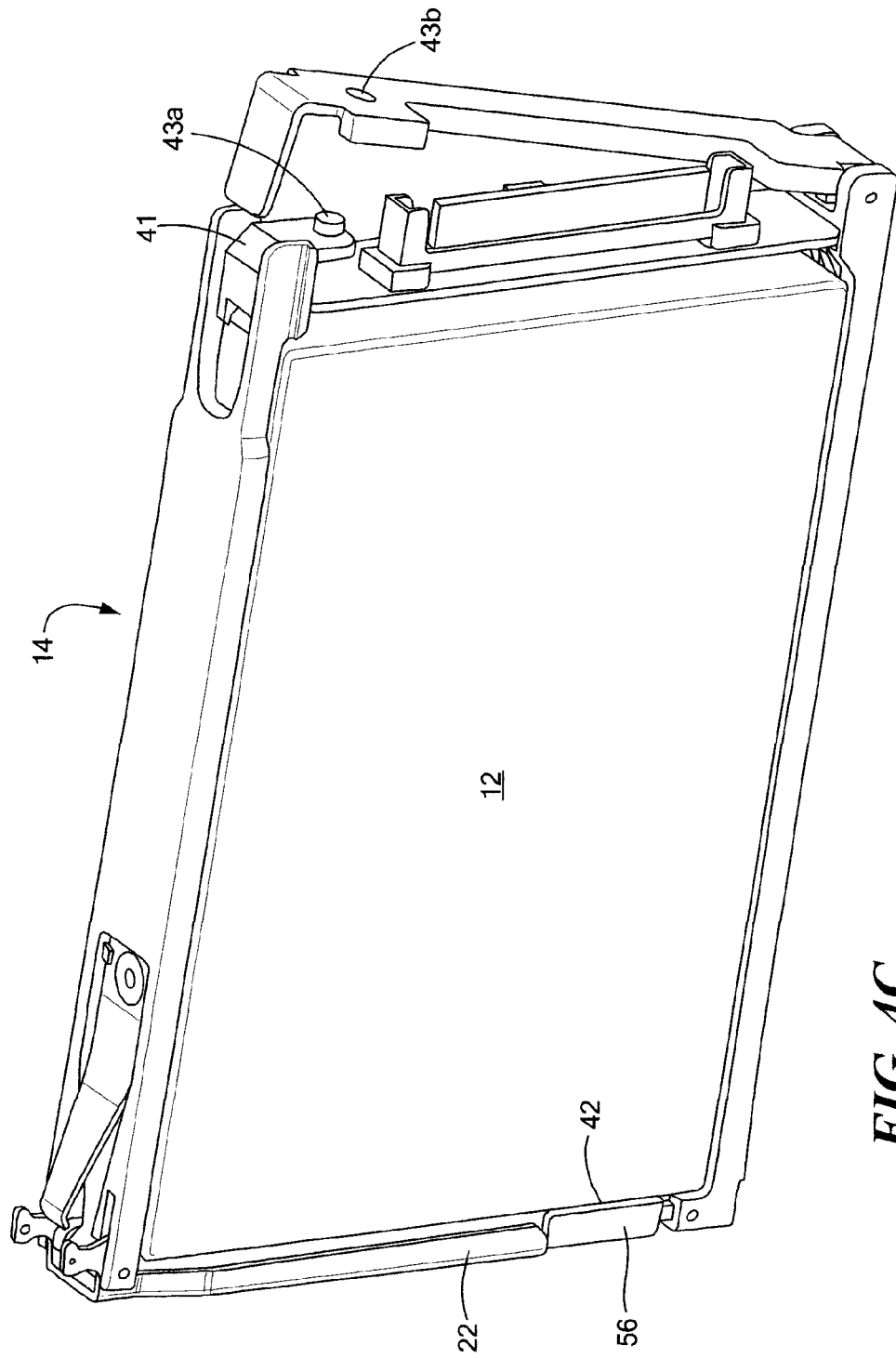

It is also noted that the data storage drive 12 has holes 51a in the sides, as shown in FIG. 4A. These holes 51a are aligned with posts 51b formed in the inner surface of the side members 16, 18 prior to snapping the "free ends" together. It is also noted that pads 53, of polystyrene foam, rubber or other shock absorbing material, are captured by the posts 51b abut the sides of the drive 12 when the frame is closed.

The arm 43 may, at some later time to remove the drive 12, be manual lifted upward away from the slot to disengage the elements of the snap and hence disengage the free ends. When the carrier 14 is in the position shown in FIG. 3, wherein the second one of the pair of opposing side members and the second one of the front and back members are pivotally attached to the L-shaped portion of the carrier at first ends thereof and wherein second ends thereof are attached to together to form a closed frame having a rectangular-shaped window after receiving and storing therein a data storage drive.

Figure 5:
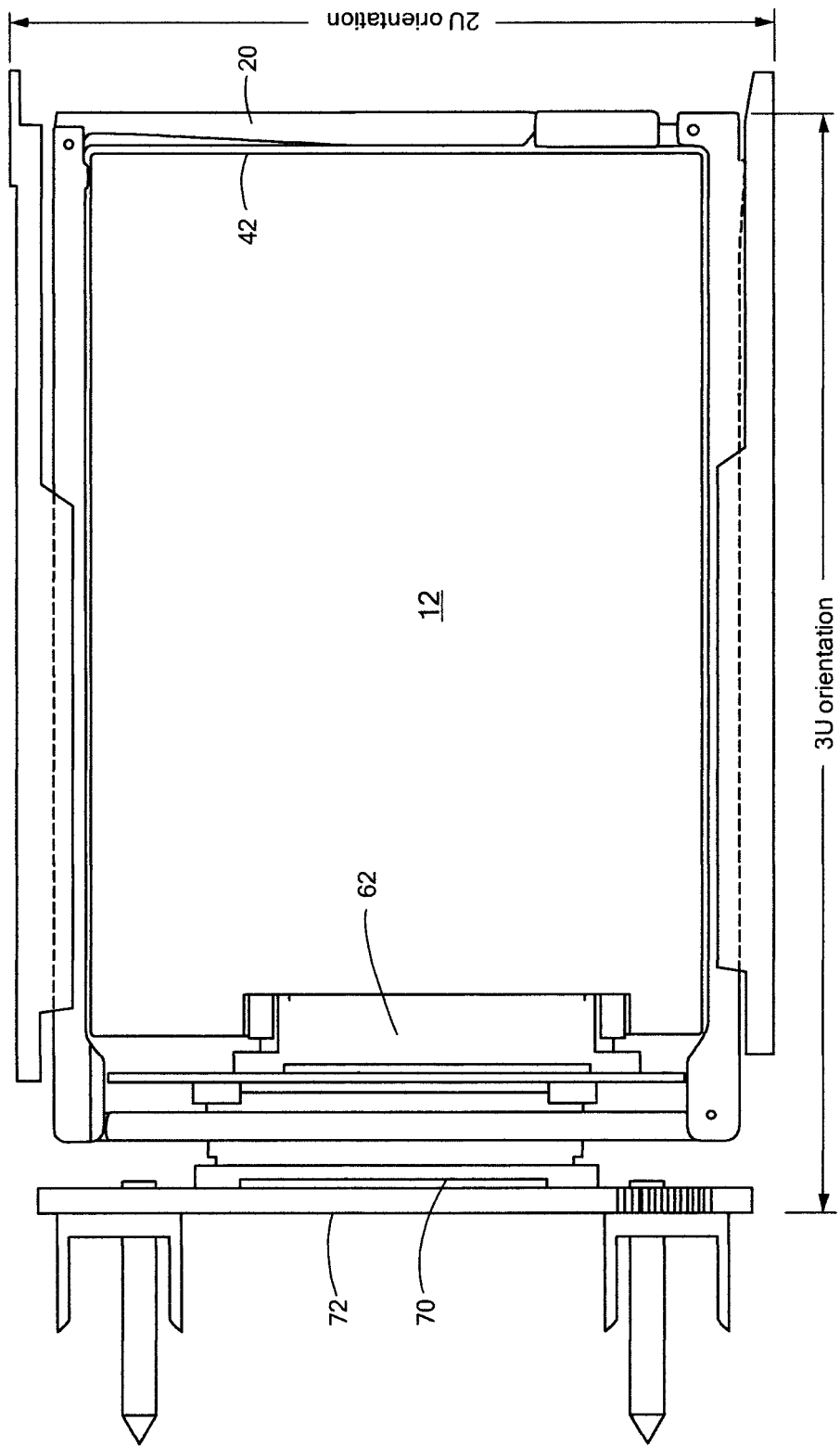
FIG. 5 is a plan elevation view of the data storage drive carrier of FIG. 2 having retained therein the data storage drive of FIG. 2 plugged into a backplane of one of the chassis of FIG. 1A or 1B.

It should be noted that a front end 42 (FIG. 4A) of the data storage drive 12 abuts the front member 20 with the data storage drive 12 received within the carrier 14, as shown in FIG. 5.

Figure 6:
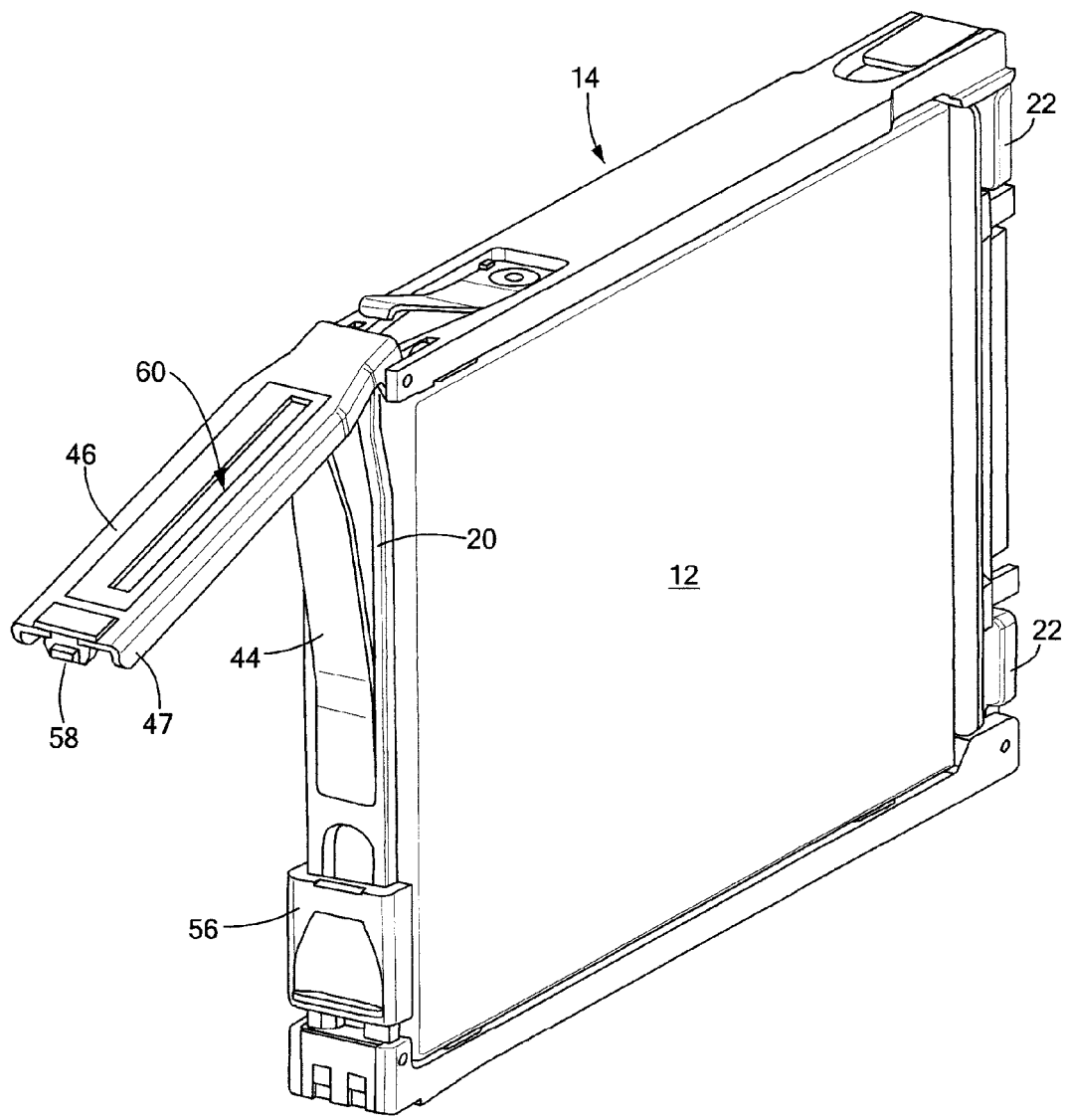
FIG. 6 is a perspective drawing of one of the data storage drive carriers according to an embodiment of the invention having one of the 2.5 inch data storage drives retained therein and with a handle on the carrier in an open position.

The carrier 14 also includes a leaf spring 44 (FIG. 6) attached to the front member 20. A handle 46 is pivotally mounted to the front member 20, the spring 44 being disposed between the handle 46 and the front member 20. When the handle 46 is pivoted towards the front member 20, the spring 44 compresses and urging the data storage drive 12 towards the back member 22.

Figure 9:
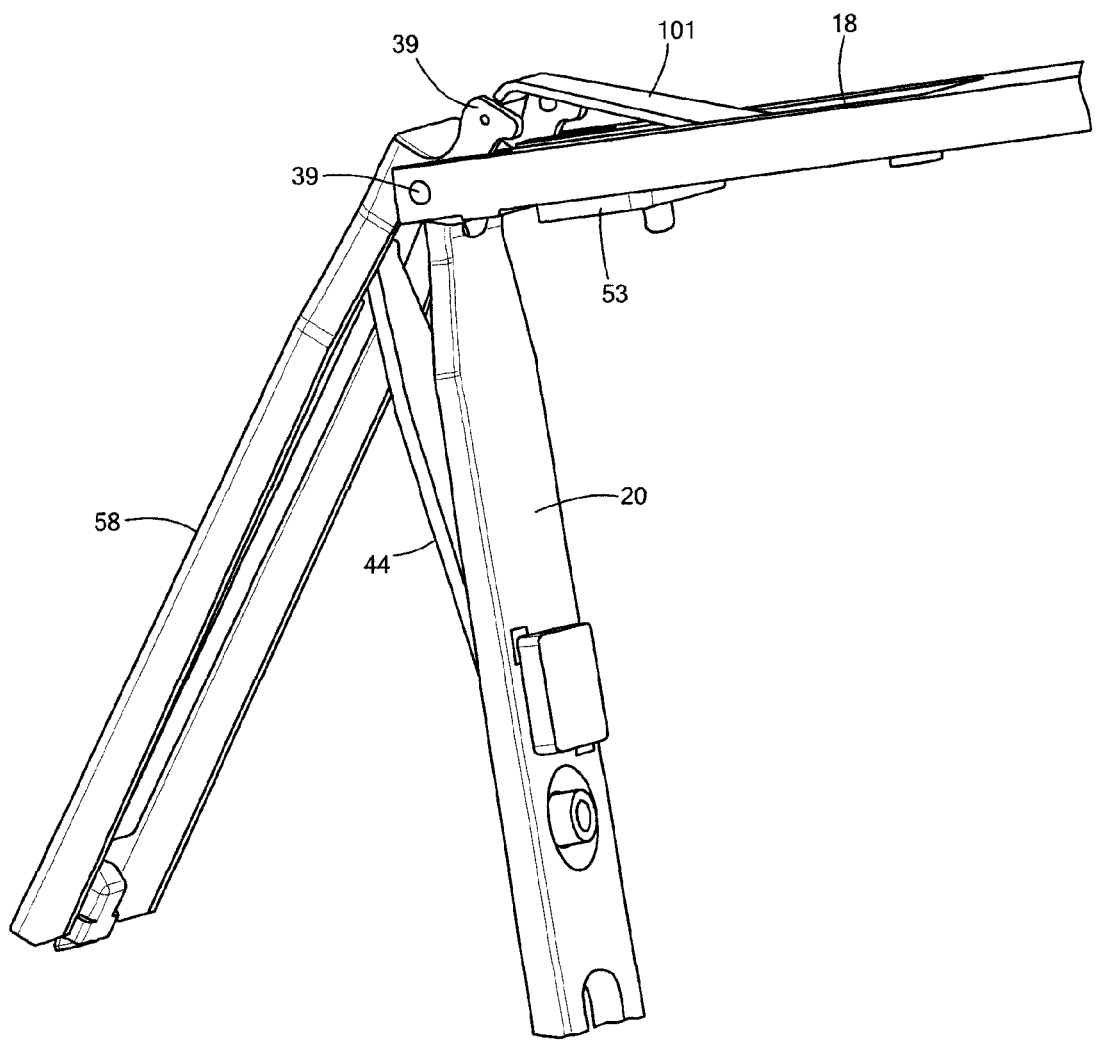
FIG. 9 shows in more detail the coupling of a front member of the data storage drive carrier of FIG. 2 to a side member.
Figure 10:
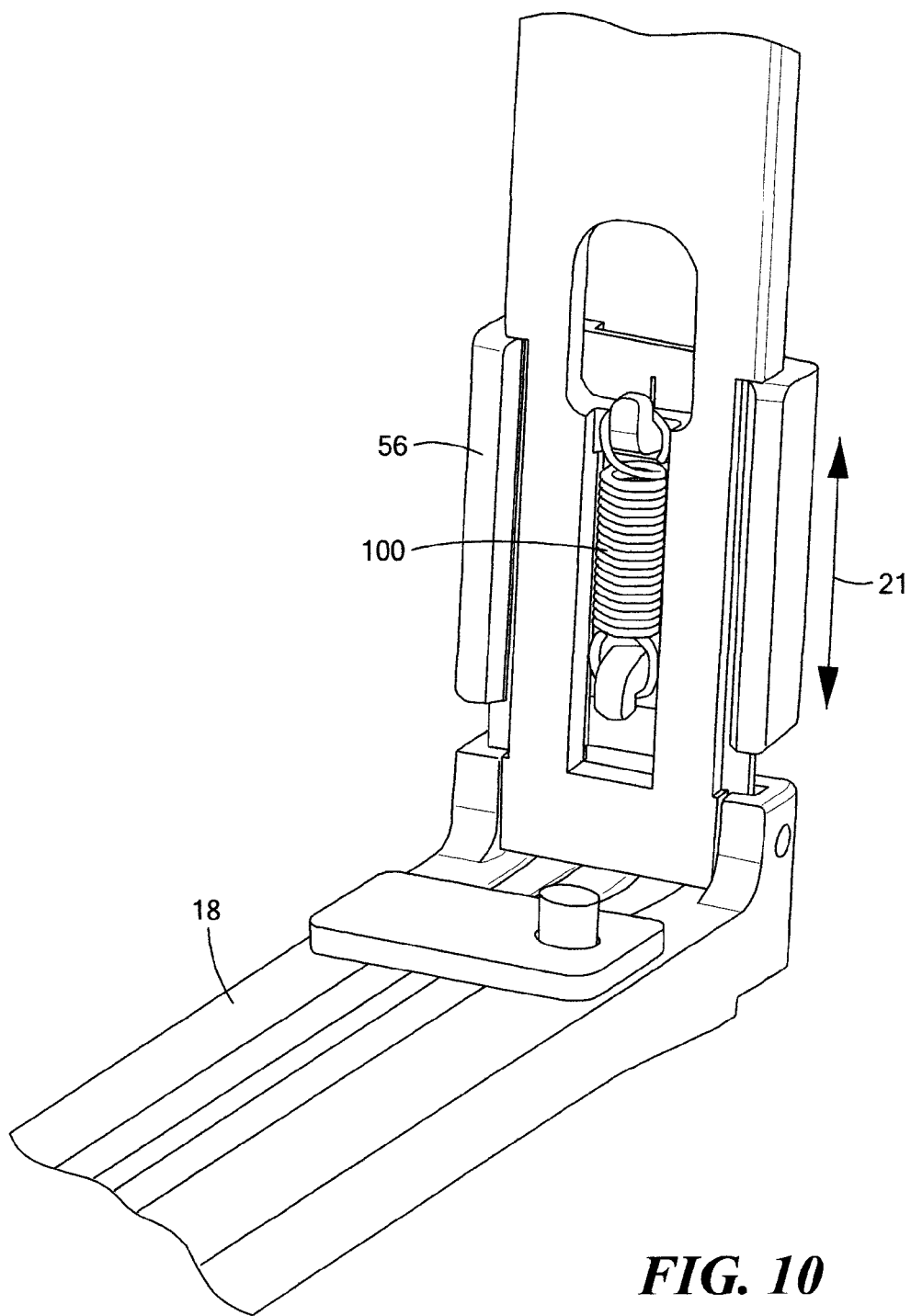
FIG. 10 shows in more detail the coupling of a spring mounted to the front member of the data storage drive carrier of FIG. 2 to a side member.

More particularly, the free end 47 of handle 46 is manually attachable and detachable to and from the front member 20 by a latching mechanism comprising: a spring loaded portion or latch 56 slidably attached to the front member 20; and, a catch 58 fixed on the handle 46. As noted above, the spring 44 is attached to the front member 20 and is disposed between the handle 46 and the front member 20. The spring loaded latch 56 slides along the side member 20 in the direction 21 shown in FIGS. 2 and 10. The spring 44 (FIG. 2) is compressed when the handle 46 is latched to the front member 20 by manually sliding the slidable latch 56 of the latch mechanism towards the catch 58 to engage the catch 58 and thereby secure the handle 46 to the front member 50, as shown in FIG. 2. When the slidable latch 56 is manually slid away from the catch 58 the handle 46 is disengaged from the slidable portion 56 and the spring 44 urges the handle 46 to pivot away from the front member 50. It is noted that the latch 56 is spring loaded by a spring 100 (FIG. 9). The spring 100 has one end connected to the front member and a second end connected to the latch 56. The spring 100 urges the latch 56 towards the side member 18.

Figure 7:
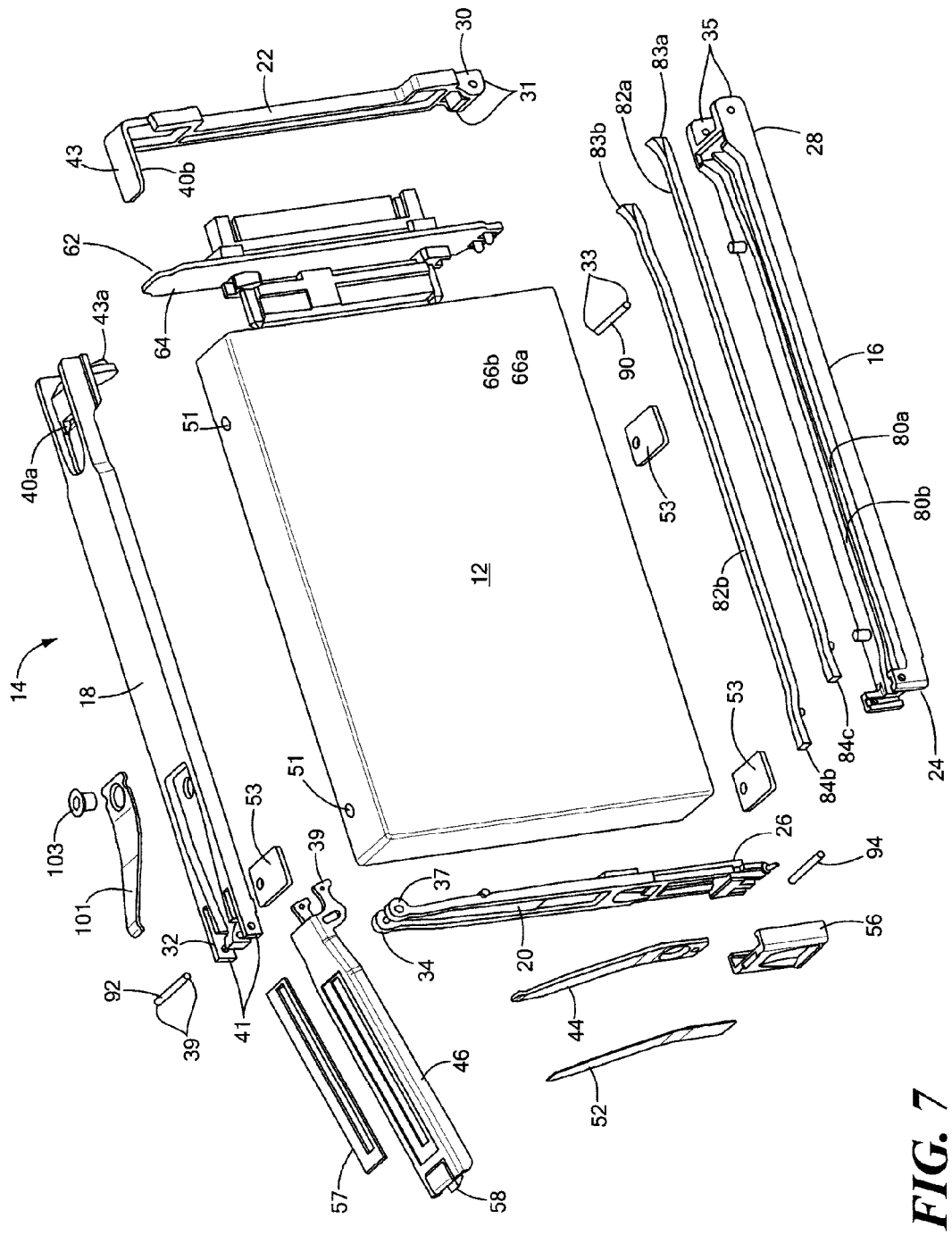
FIG. 7 is an exploded assembly-type drawing one of the data storage drive carriers according to an embodiment of the invention having one of the 2.5-inch data storage drives retained therein.

The handle 46 has a window 60 to expose a portion of the front member 20. A bar code strip 52 (FIG. 7) is attached to the portion of the front member 20 exposed by the window 60. A drive capacity label 57 (FIG. 7) is attached to the outer surface of the handle 46.

Referring now to FIG. 4A, it is noted that an interposer 62 is plugged into a back end of the data storage drive 12. The interposer 62 has a printed circuit board 64 with electrical components thereon; one of such components including a light source 66, (here a pair of light sources 66a, 66b, such as light emitting diodes (LEDs)). The interposer 62 is disposed adjacent the back member 22 and is, as noted above, plugged into the data storage drive 14 on one side and into an electrical receptacle 70 (FIG. 5) on backplane printed circuit 72 in the chassis 10a, 10b (FIGS. 1A, 1B) on the other side. As noted above, when the handle 46 (FIG. 6) is pivoted towards the front member 20, the spring 44 compresses and urging the data storage drive 12 towards the back member 22 and thereby urges the interposer 62 plug further into the electrical receptacle 70 on the backplane 72. Any manufacturing tolerances are taken by the degree of compression of the spring 44.

Referring again to FIG. 7, one of the pair of opposing side members, here member 16 has a pair of grooves 80A, 80b formed therein. A pair of light pipes 82a, 82b (FIGS. 4A, 7) is disposed and affixed within the grooves, 80A, 80b, respectively. One end 83a, 83b (FIG. 4A) of the light pipes 82a, 82b is disposed adjacent to the pair of light sources 66a, 66b, respectively, to receive optical signals emitted by the light sources 66a, 66b, respectively and an opposite ends 84a, 84b (FIG. 4A) of the light pipes 82a, 82b, respectively are disposed adjacent windows 86a, 86b, respectively on the front member 20 to transmit such optical signals towards the front member 20. The light viewed through the windows 74, 76 (FIG. 2) is viewable by a detector, not shown, or by a human. The light indicates whether the drive is operating properly or if there is a fault.

Figure 8A:
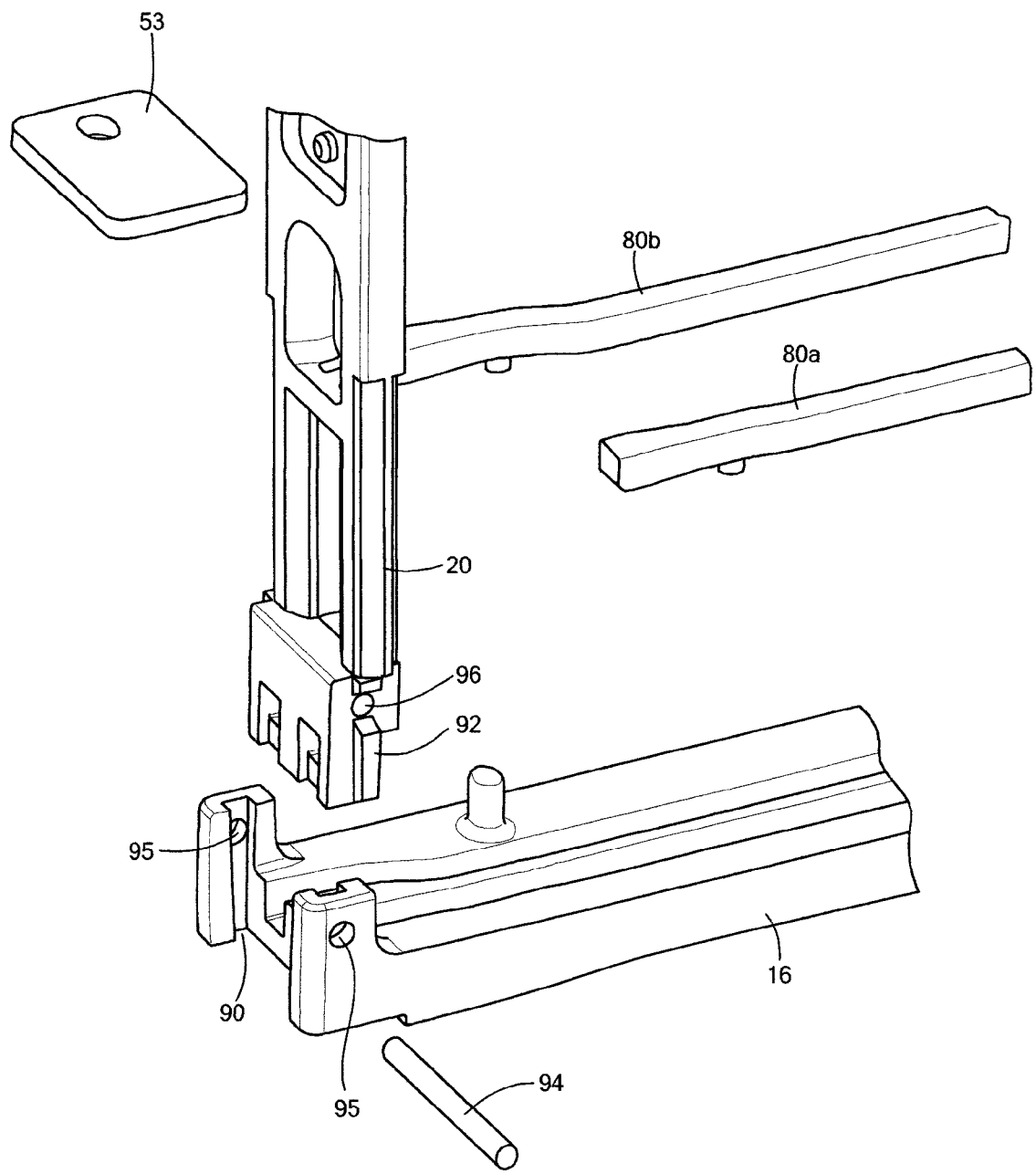
FIGS. 8A and 8B are drawings useful in understanding the assembly of a pair of members of the data storage drive carrier of FIG. 2, FIG. 8A showing the members prior to assembly and FIG. 8B showing the members after assembly.
Figure 8B:
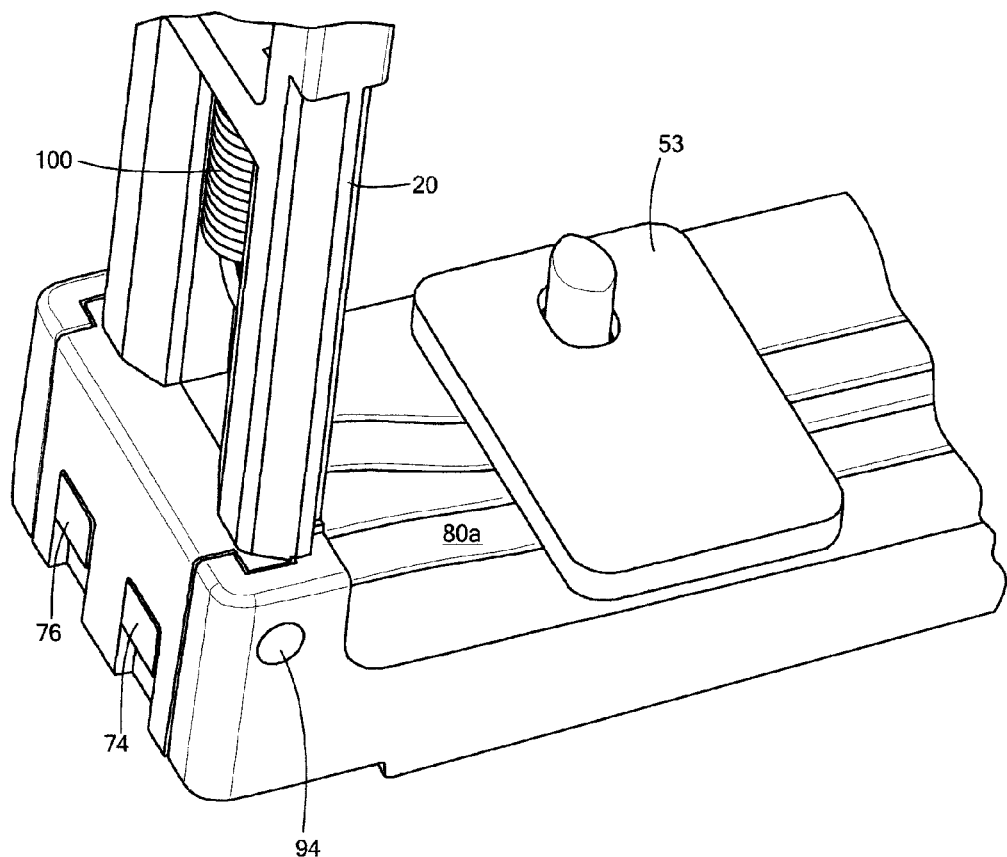

As noted above, and again referring to FIG. 7, the carrier 14 comprises: the pair of opposing side members 16, 18; the front member 20; and the back member 22. A first end 24 of side member 16 is rigidly fixed to a first end 26 of the front member 20. More particularly, referring to FIG. 8A, side member 16 is formed a pair of opposing slots 90, only one being shown, for receiving, when being assembled, a pair of ribs 92 formed on opposite sides of front member 20, only one of the ribs 92 being shown, and a pair of holes 96 passing through the front member 20, only one being shown. After the ribs 92 are inserted into the slots 90, a pin 94 is inserted into and through the holes 95 and 96. More particularly, the pin 94 is press fit in the holes 95 and 96. Thus, after assembly, as shown in FIG. 8B (herewith spring loaded latch 56 also being shown), the member 20 is rigidly affixed to member 16 to form the L-shaped portion of the carrier A second end 28 of side member 16 is pivotally attached to a first end 30 of the back member 22 using a hinge-like means including a pin 90 which serves as an axle for the hinge-like means and which passes through, and is press fit in, axial holes 31 formed at end 30 and has ends 33 retained in opposing inner sides 35 of end 28. A first end 32 of side member 18 is pivotally attached a second end 34 of the front member 20 using a hinge-like means including a pin 92 which serves as an axle for the hinge-like means and which passes through, and is press fit in, axial holes 37 formed at end 30 and the pivoting end of handle 46 and has ends 39 retained in opposing inner sides 41 of end 32. It is noted that a leaf spring 101 is attached the outer surface of side member 18 with a rivet 103.

A number of embodiments of the disclosure have been described. Nevertheless, it will be understood that various modifications may be made without departing from the spirit and scope of the disclosure. For example, a screw or other fastening means may be used in place of the snap 40. Accordingly, other embodiments are within the scope of the following claims.

What is claimed is:

1. A data storage drive carrier for receiving therein a data storage drive, such carrier comprising:
   a pair of opposing side members;
   a front member; and
   a back member;
   wherein a first end of a first one of the pair of opposing side members is attached to a first end of the front member;
   wherein a second end of the first one of the pair of opposing side members is pivotally attached to a first end of the back member;
   wherein a first end of a second one of the pair of opposing side members is pivotally attached a second end of the front member;
   wherein a second end of the second one of the pair of opposing member and a second end of the back member are attachable one to the other with the data storage drive received within the carrier; and
   a handle having one end pivotally attached to one end of the front member, such handle having a window to expose a portion of the front member, and a bar code strip, attached to the portion of the front member and exposed by the window.

2. The data storage drive carrier recited in claim 1 wherein the first end of the first one of the pair of opposing side members is rigidly fixed to the first end of the front member.

3. The data storage drive carrier recited in claim 1 wherein the second end of the second one of the pair of opposing member and the second end of the back member have thereon respective elements of a snap wherein the second end of the second one of the pair of opposing member and the second end of the back member are snapped together by the snap with the data storage drive received within the carrier.

4. The data storage drive carrier recited in claim 1 wherein a front end of the data storage drive abuts the front member with the data storage drive received within the carrier.

5. The data storage drive carrier recited in claim 1 including:
   a spring attached to the front member;
   a handle pivotally mounted to the front member, the spring being disposed between the handle and the front member, and
   wherein when the handle is pivoted towards the front member, the spring compresses and urging the data storage drive towards the back member.

6. The data storage drive carrier recited in claim 1 include:
   an interposer having a printed circuit board with electrical components thereon one of such components including a light source, the interposer being disposed adjacent the back member and being plugged into the data storage drive;
   wherein one of the pair of opposing side members has a groove formed therein;
   a light pipe disposed within the groove, one end of the light pipe being disposed adjacent to the light source to receive optical signal emitted by the light source and an opposite end of the light pipe being disposed the front member to transmit such optical signals towards the front member.

7. A data storage drive carrier for receiving therein a data storage drive, such carrier comprising:
   a pair of opposing side members;
   a front member; and
   a back member;
   wherein a first end of a first one of the pair of opposing side members is attached to a first end of the front member;
   wherein a second end of the first one of the pair of opposing side members is pivotally attached to a first end of the back member;
   wherein a first end of a second one of the pair of opposing side members is pivotally attached a second end of the front member; and
   wherein a second end of the second one of the pair of opposing member and a second end of the back member are attachable one to the other with the data storage drive received within the carrier; and
   a handle having one end pivotally attached to one end of the front member, such handle having a window to expose a portion of the front member; and a bar code strip, attached to the portion of the front member and exposed by the window.

8. A data storage drive carrier assembly, comprising:
a data storage drive;
a carrier for receiving the data storage drive, such carrier having:
- a pair of opposing side members;
- a front member attached to the pair of side member;
- a rear member attached to the pair of side members;
- a handle having one end pivotally attached to one end of the front member, such handle having:
  - a window to expose a portion of the back member; and
  - a bar code strip, attached to the portion of the front member and exposed by the window.

9. The data storage drive carrier recited in claim 8 including:
- a latch having: a slidable portion attached to the front member; and, a catch fixed on the handle;
- a spring disposed between the handle and the front member; and
- wherein the spring is compressed when the handle is latched to the front member and wherein when the slidable portion is manually slid away from the catch the handle is disengaged from the slidable portion and the spring urges the handle to pivot away from the front member.

\* \* \* \* \*